United States Patent
Choi et al.

(10) Patent No.: US 6,621,152 B2
(45) Date of Patent: Sep. 16, 2003

(54) THIN, SMALL-SIZED POWER SEMICONDUCTOR PACKAGE

(75) Inventors: Yoon-hwa Choi, Incheon (KR); Shi-baek Nam, Incheon (KR)

(73) Assignee: Fairchild Korea Semiconductor Ltd., Kyungki-do (KR)

( * ) Notice: Subject to any disclaimer, the term of this patent is extended or adjusted under 35 U.S.C. 154(b) by 0 days.

(21) Appl. No.: 09/896,120

(22) Filed: Jul. 2, 2001

(65) Prior Publication Data

US 2002/0074634 A1 Jun. 20, 2002

(30) Foreign Application Priority Data

Dec. 19, 2000 (KR) .......................... 2000-78538

(51) Int. Cl.[7] .............................................. H01L 23/02
(52) U.S. Cl. ..................... 257/678; 257/690; 257/718; 257/778; 257/779; 257/780
(58) Field of Search .................. 257/678, 390, 257/691, 705–707, 717–720, 737, 778–780, 784, 796; 438/106, 117, 122, 125, 612

(56) References Cited

U.S. PATENT DOCUMENTS

| | | | |
|---|---|---|---|
| 5,636,104 A | * | 6/1997 | Oh ............................. 257/737 |
| 5,693,573 A | | 12/1997 | Choi |
| 5,760,469 A | * | 6/1998 | Higashiguchi et al. ...... 257/678 |
| 5,783,865 A | * | 7/1998 | Higashiguchi et al. ...... 257/778 |
| 6,040,702 A | * | 3/2000 | Hembree et al. ............ 257/737 |
| 6,208,525 B1 | * | 3/2001 | Imasu et al. ................ 257/778 |
| 6,255,740 B1 | * | 7/2001 | Tsuji et al. .................. 257/690 |
| 6,316,822 B1 | * | 11/2001 | Venkateshwaran et al. .. 257/778 |
| 6,365,980 B1 | * | 4/2002 | Carter, Jr. et al. .......... 257/787 |
| 6,426,642 B1 | * | 7/2002 | Akram et al. ............... 257/778 |
| 2001/0020736 A1 | * | 9/2001 | Nakazawa et al. .......... 257/678 |

OTHER PUBLICATIONS

JEDEC Solid State Product Outline, Thermally Enhanced Plastic Very Thin and Very Very Thin Fine Pitch Quad Flat No Lead Package, Package Designator HP–VFQFP–N & HP–WFQFP–N, Issue C, MO–220, May 2001, sheets 1 through 3 of 41.

JEDEC Solid State Product Outlines, Very Very Thin Quad Bottom Terminal Chip Carrier Family, JESD–30 Designator W–PBCC–B/WH–PBCC–B, Issue A, Oct. 1999, MO–217, sheets 1 and 2 of 6.

JEDEC Solid State Product Outlines, Plastic Ultra–Thin Small Outline No–Lead Package, JESD–30 Designator R–PDSO–N, Issue C, Apr. 1998, MO–196, Sheets 1 and 2 of 8.

* cited by examiner

*Primary Examiner*—Steven Loke
*Assistant Examiner*—Quang Vu
(74) *Attorney, Agent, or Firm*—Rothwell, Figg, Ernst & Manbeck

(57) ABSTRACT

A power semiconductor package is provided. The power semiconductor package includes a chip, leads, conductive media, and a molding material. The leads have a groove in the shape of a hemisphere or a down-set. The package further includes an adhesive. The package can increase solder joint reliability and thermal performance. Also, the size of the package can be reduced, and sawing can be performed so that a burr does not occur.

34 Claims, 11 Drawing Sheets

THIN, SMALL-SIZED POWER SEMICONDUCTOR PACKAGE

BACKGROUND OF THE INVENTION

1. Field of the Invention

The present invention relates to a semiconductor device, and more particularly, to a thin, small sized power semiconductor package.

2. Description of the Related Art

Recently, the size of electronic products such as personal computers, cellular phones, and camcorders, is becoming smaller, whereas the capacity of electronic products is becoming larger. Accordingly, chips used in electronic products should be small in size and large in capacity. Besides, a small-sized semiconductor package having a large capacity, which is appropriate even for high processing speeds, is necessary. Chips in a semiconductor package are protected from outside shock, and the chips should be conveniently and securely mounted on a board. Further, a power semiconductor package to which a high voltage is applied should have excellent thermal performance that quickly dissipates heat generated in the chips.

Hereinafter, a semiconductor package according to the prior art will be described with reference to the attached drawings.

A semiconductor package shown in FIGS. 1A through 1C is a quad flat no-lead (QFN) package registered in international standards (JEDEC-MO-220) in 2000. The QFN package is a well-known traditional package of reduced size. FIG. 1A is a perspective view of a conventional QFN package, and for the convenience of explanation, the bottom of the package faces upward. FIG. 1B is a plan view of the QFN package, and FIG. 1C is a sectional view of the QFN package mounted on a board.

Referring to FIGS. 1A through 1C, a chip 1 is bonded to a die pad 11 of a lead frame by an adhesive 7. Bonding wires 5 electrically connect bond pads 1a of the chip 1 to leads 9. The chip 1, the bonding wires 5, the die pad 11, and the leads 9 are molded by a molding material 3. The leads 9 are bonded to a solder paste 13, and thus a QFN package 50 is mounted on a board 60.

A lot of heat is generated in a chip 1, especially, in a power semiconductor chip, when the chip 1 is operated. Heat can cause a malfunction of internal devices. Thus, a power semiconductor package should have excellent thermal performance so that the heat may be quickly dissipated away from the power semiconductor QFN package 50. The chip 1 is mounted only on the die pad 11 of the lead frame and is not mounted on the leads 9 of the lead frame. Thus, the heat generated from the chip 1 is conducted to the die pad 11 by the adhesive 7. Preferably, the heat conducted to the die pad 11 is quickly dissipated by ground wiring (not shown) formed on the board 60 under the package 50. The reason why the heat is dissipated by the ground wiring is that heat flows through a conductive material faster than it flows through a molding material. However, in the conventional package shown in FIG. 1C, an exposed die pad 11a is not connected to the ground wiring (not shown) of the board 60 and is surrounded by the peripheral leads 9. Thus, it is difficult for the heat conducted to the exposed die pad 11a to be dissipated via the ground wiring and air.

The chip 1, the bonding wire 5, the die pad 11, and the leads 9 are molded by the molding material 3. An external connection terminal 9a of the leads 9 must be not molded by the molding material 3 so that the leads 9 electrically connected to the bonding pad 1a of the chip 1 may be connected to the board 60 outside of the QFN package 50. The external connection terminal 9a is bonded to the solder paste 13 and exchanges electrical signals with the board 60. For the purpose of reliable exchange of electrical signals between the chip 1 of the QFN package 50 and the board 60, the external connection terminal 9a must be exactly fixed in the board 60. However, since the external connection terminal 9a is flat, if the QFN package 50 is mounted incorrectly on the board 60, the area where is bonded and fixed by the solder paste 13 is reduced and mounting property of the QFN package 50 is lowered.

The QFN package 50 must not detach from the solder paste 13 even if there is some vibration, motion, or shock to the QFN package 50. However, since the external connection terminal 9a is flat, stress caused by shock to the QFN package 50 is not alleviated and is transmitted to the solder paste 13. Thus, the solder joint is less reliable.

Grooves 17 are formed on lower portions of the leads 9 and the die pad 11 so that the leads 9 and the die pad 11 do not detach from the QFN package 50 after the molding material 3 is molded. As shown in FIG. 1C, the grooves 17 are formed only by an etched lead frame. Since the etched lead frame is manufactured using an etching solution in a one-time etching process, the manufacturing cost is high, and it takes much time to manufacture the etched lead frame. Thus, the etched lead frame is not appropriate for the QFN package.

Another method for manufacturing the lead frame includes a stamping process. Mass production of the stamped lead frame is possible, and the manufacturing cost is low. Thus, in order to reduce the manufacturing cost of the QFN package, it is preferable to manufacture a lead frame by the stamping process. However, only the etched lead frame is used as the lead frame of the QFN package 50.

The die pad 11 of the QFN package 50 is larger than the chip 1. The adhesive 7 is bonded on the entire bottom surface of the chip 1 to join the chip 1 and the die pad 11 to each other. The adhesive 7 is a paste including, for example, silver (Ag). When the size of the chip 1 becomes large, the size of the die pad 11 must become large. Thus, the lead frame must be re-manufactured according to the size of the chip 1.

The QFN package 50 can be molded by a block mold type and undergo a sawing process or by an individual mold type and undergo a trimming process. In the case of the block mold type using the sawing process for singularization of the QFN package 50, a burr remains in a side part 9b of the leads 9 after sawing. In the case of the individual mold type, the burr does not occur. But, since a mold die frame must be manufactured according to the size of the QFN package, manufacturing cost of the QFN package is increased.

FIG. 2 is a sectional view of a side pad-bottom lead package (S-BLP) mainly used at an industrial site. The S-BLP is a package applied in the structure in which a bonding pad is formed around a chip. The chip 1 is mounted on leads 10 and is bonded to the leads 10 by an adhesive tape 8 bonded to part of the bottom surface of the chip 1. Also, one end of the leads 10 toward the side of a S-BLP 52 are surrounded by molding material 3 above and below. Thus, in a case where the S-BLP 52 is singularized by the block mold type, the burr does not occur in the ends of the leads 10.

Since the chip 1 and the leads 10 are bonded by the adhesive tape 8 and the heat conductivity of the adhesive tape 8 is poor, the adhesive tape 8 is not soft enough for motion such as oscillation. Thus, thermal performance and solder joint reliability are lessened.

SUMMARY OF THE INVENTION

To solve the above problems, it is an object of the present invention to provide a thin, small-sized power semiconductor package, which is capable of improving solder joint reliability, mounting property, and thermal performance and reducing package size.

To achieve the above object, according to a first preferred embodiment of the present invention, there is provided a power semiconductor package. The power semiconductor package includes a plurality of leads each having a groove, a chip mounted on the leads, a plurality of conductive media for electrically connecting the leads to the chip, and a molding material. The groove is arranged along a side of the chip such that the inner surface of the groove faces the chip, and the molding material molds the chip, the leads, and the conductive media so that part of an outer surface of the groove is exposed.

It is preferable that the package further comprises an adhesive for bonding the chip to the leads. Preferably, the adhesive is rubins inserted on an inner surface of the groove or a flat plate adhesive for bonding the entire bottom surface of the chip. The flat plate adhesive is formed of one material selected from material groups formed of silica, aluminum nitride (AlN), and alumina ($Al_2O_3$).

The conductive media are preferably bonding wires or solder bumpers.

The leads are preferably arranged in a parallel structure or a rectangular structure.

The shape of the groove may be a hemisphere having a diameter between 100 $\mu$m and 500 $\mu$m. The amount in which part of an outer surface of the groove is exposed is between 20 $\mu$m and 300 $\mu$m. A plating film is further included on the outer surface of part of an outer surface of the groove, and a metal layer is further included on an inner surface of the inner surface of the groove. The metal layer is formed of one material selected from nickel (Ni) and an alloy of Ni and tin (Sn).

The shape of the groove may also be a down-set shape having an inner surface depth between 50 $\mu$m and 375 $\mu$m. A seating groove for seating the conductive media is further formed on the inner surface of the groove. A plating film is further included on the outer surface of part of an outer surface of the groove. The plating film is formed of one material selected from material groups formed of an alloy of Sn and Pb, Sn, Ni, and a multilayer of Ni and Pd.

The seating groove further includes a metal layer on its surface, and the metal layer is formed of one material selected from Ni and an alloy of Ni and Sn. The sectional shape of the seating groove is an arc, and the depth of the seating groove is between 60 $\mu$m and 300 $\mu$m.

In order to achieve the above object, according to a second preferred embodiment of the present invention, there is provided a power semiconductor package. The power semiconductor package includes a plurality of leads each having a hemispheric groove, a chip mounted on the leads, an adhesive for bonding the leads to the chip, a plurality of bonding wires for electrically connecting the leads to the chip, and a molding material. The groove is arranged along a side of the chip such that the inner surface of the groove faces the chip, and the chip is mounted on the leads such that the bottom surface of the chip faces an inner surface of the groove. The solder bumpers are inserted on the inner surface of the groove of the leads. The molding material molds the chip, the leads, and the solder bumpers so that part of an outer surface of the groove projects past the molding material and the bottom surface of the chip is exposed.

The thickness of the molding material is preferably between 0.7 $\mu$m and 1.5 $\mu$m.

In order to achieve the above object, according to a third preferred embodiment of the present invention, there is provided a power semiconductor package. The power semiconductor package includes a plurality of leads each having a hemispheric groove, a chip mounted on the leads, a plurality of solder bumpers for electrically connecting the leads to the bonding pads on the top surface of the chip, and a molding material. The groove is arranged along a side of the chip such that the inner surface of the groove faces the chip, and the chip is mounted on the leads such that the top surface of the chip faces an inner surface of the groove. The molding material molds the chip, the leads, the adhesive, and the bonding wires so that part of an outer surface of the groove projects past the molding material. for molding the leads, the chip, and the solder bumpers so that part of an outer surface of the groove of the leads projects past the molding material.

The thickness of the molding material is preferably between 0.5 $\mu$m and 1.2 $\mu$m.

In order to achieve the above object, according to a fourth preferred embodiment of the present invention, there is provided a power semiconductor package. The power semiconductor package includes a plurality of leads each having a down-set shaped groove, a chip mounted on the leads, a flat plate adhesive for bonding the leads to the chip, a plurality of bonding wires for electrically connecting the leads to the chip, and a molding material. The groove is arranged along a side of the chip such that the inner surface of the groove faces the chip, and the chip is mounted on the leads such that the top surface of the chip faces an inner surface of the groove. The molding material molds the chip, the leads, the flat plate adhesive, and the bonding wires so that part of an outer surface of the groove is exposed.

The thickness of the molding material is preferably between 0.5 mm and 1.5 mm.

In order to achieve the above object, according to a fifth preferred embodiment of the present invention, there is provided a power semiconductor package. The power semiconductor package includes a plurality of leads each having a down-set shaped groove, a chip mounted on the leads, a plurality of solder bumpers for electrically connecting the leads to the bonding pads on the top surface of the chip, and a molding material. The groove is arranged along a side of the chip such that the inner surface of the groove faces the chip, and the chip is mounted on the leads such that the top surface of the chip faces an inner surface of the groove. The solder bumpers are inserted on the inner surface of the groove of the leads. The molding material molds the chip, the leads, and the solder bumpers so that part of an outer surface of the groove and the bottom surface of the chip are exposed.

The thickness of the molding material is preferably between 0.5 mm and 1.5 mm.

Preferably, a seating groove for seating the solder bumpers is further comprised on the inner surface of the groove.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Figure 1A:
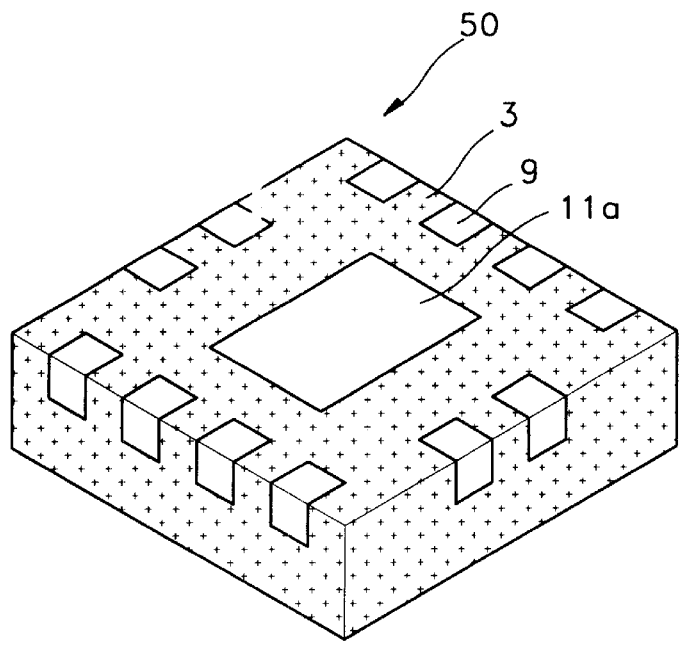
FIGS. 1A through 1C are diagrams of a conventional semiconductor package.
Figure 1B:
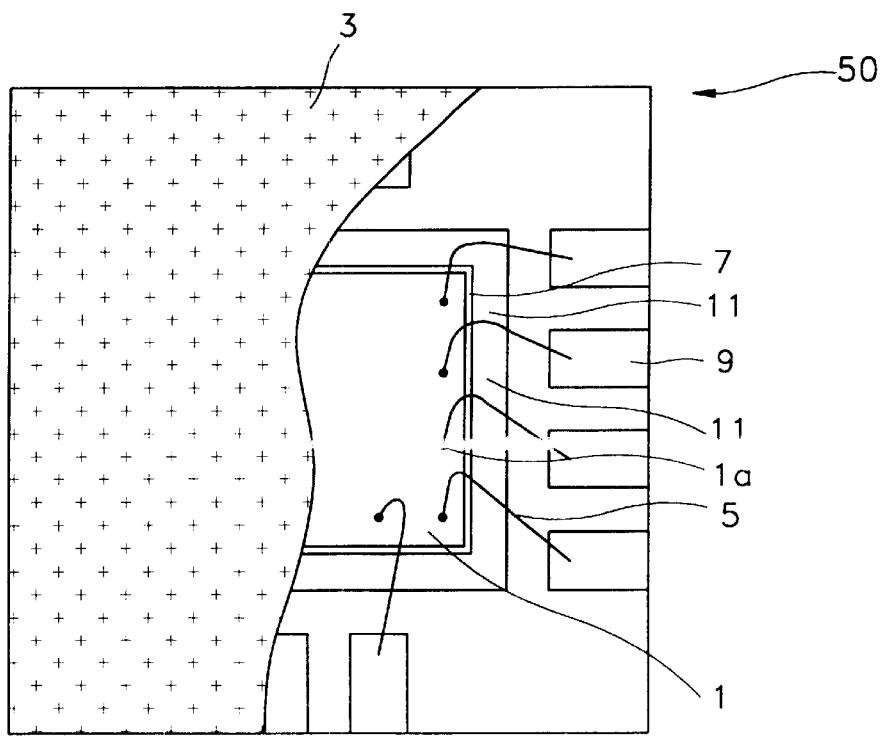
Figure 1C:
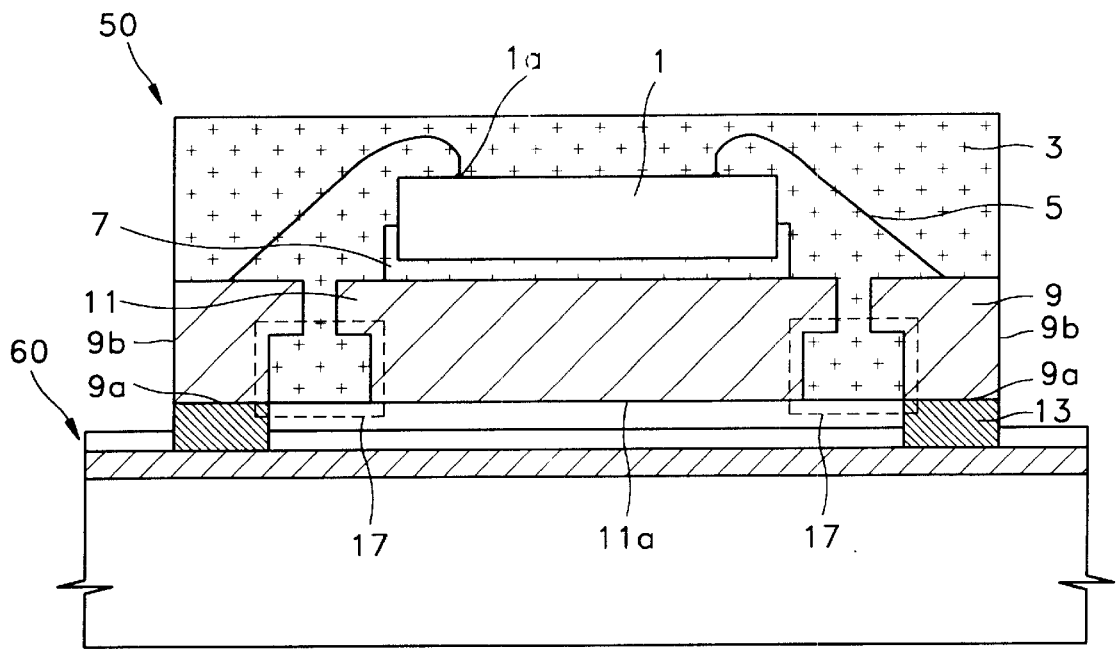
Figure 2:
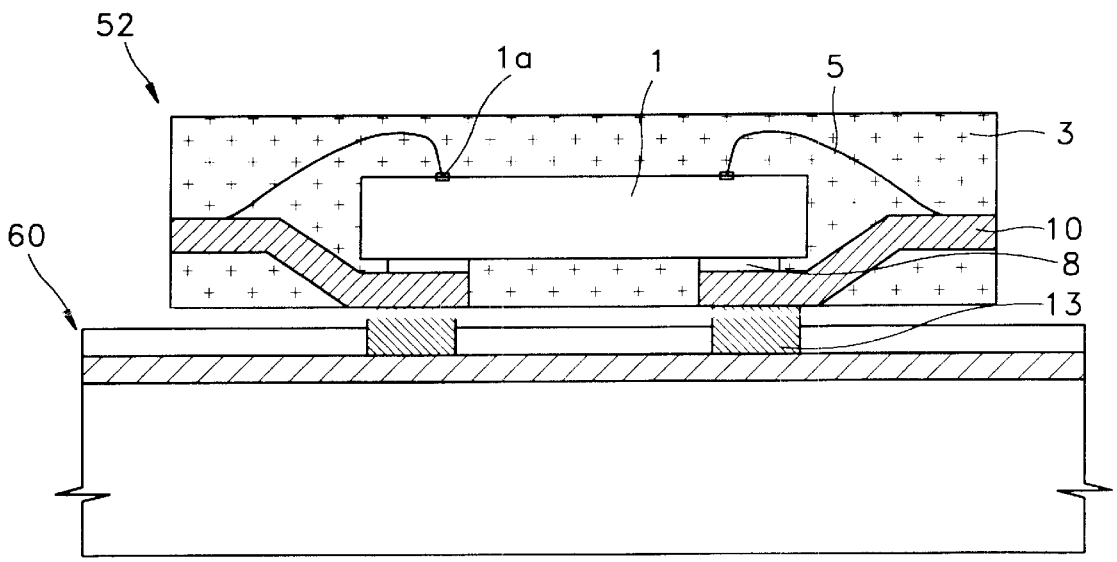
FIG. 2 is a sectional view of another package according to the prior art.

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the forms of elements are exaggerated for clarity. Like reference numerals refer to like elements throughout the drawings.

Figure 3A:
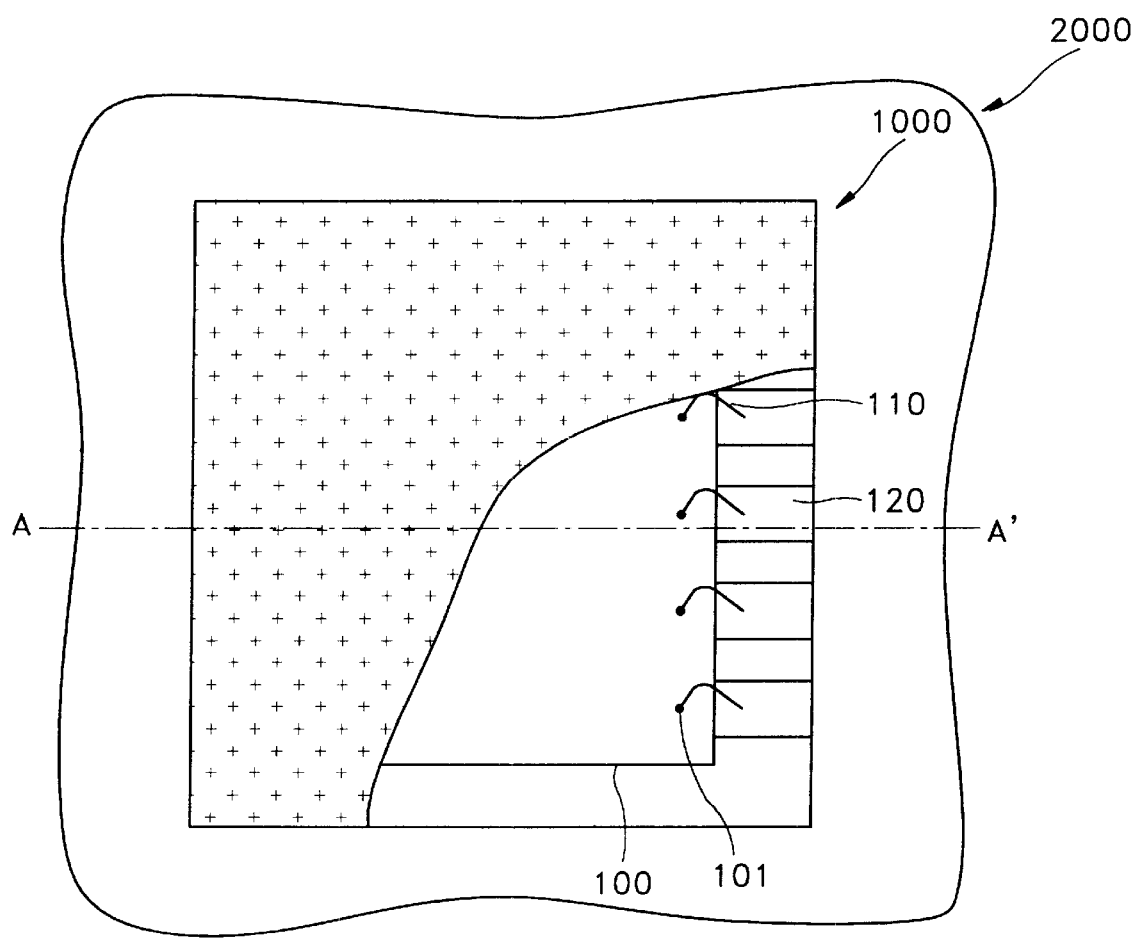
FIGS. 3A through 3D are diagrams of a power semiconductor package according to a first embodiment of the present invention.
Figure 3B:
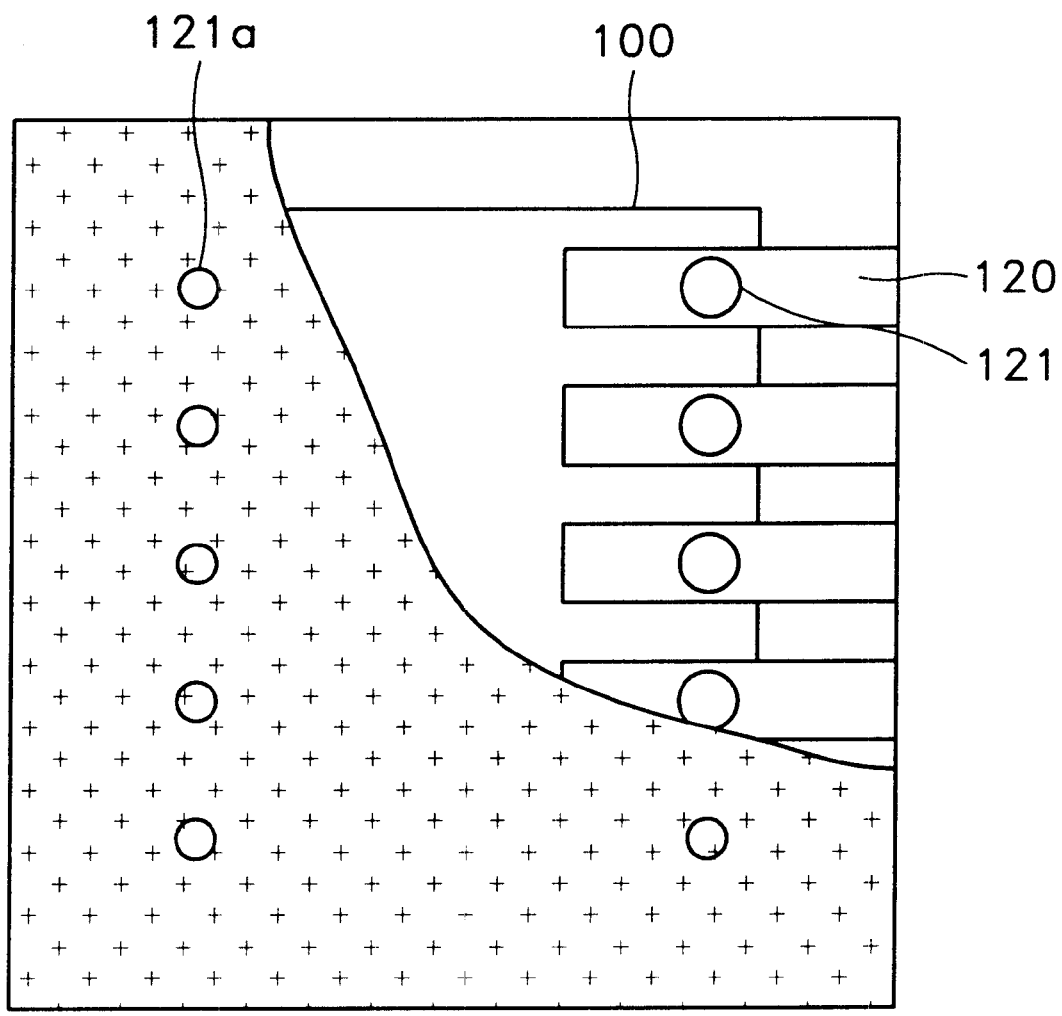
Figure 3C:
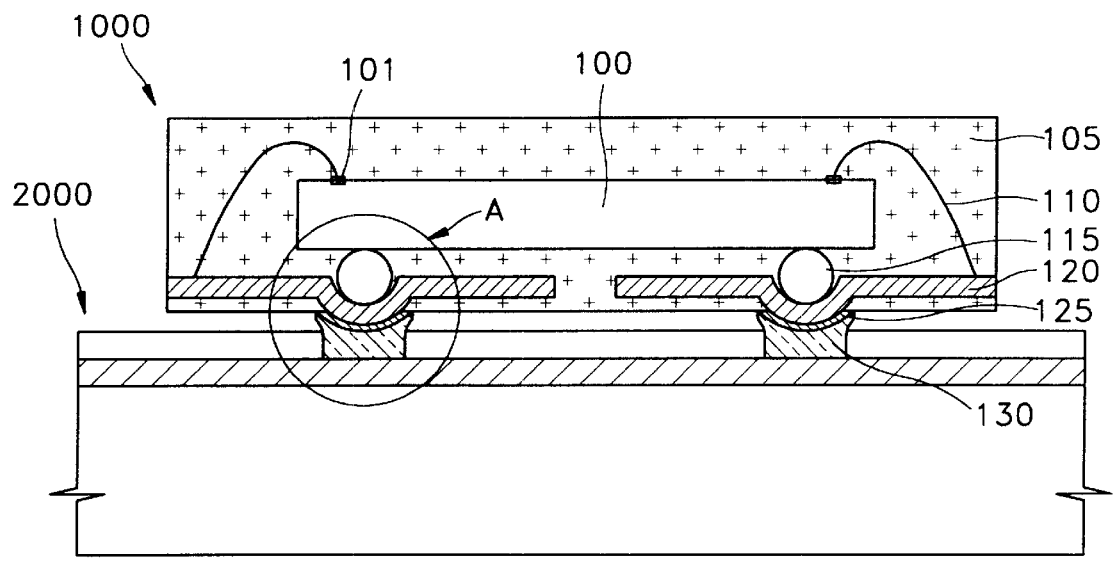
Figure 3D:
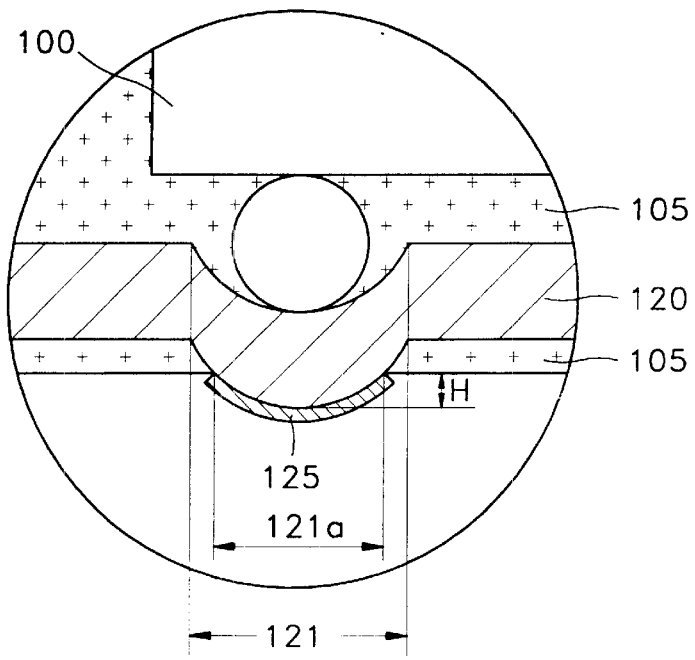

FIG. 3A is a plan view of a power semiconductor package according to a first embodiment of the present invention which is mounted on a board 2000, FIG. 3B is a bottom view of the power semiconductor package, FIG. 3C is a sectional view taken along line A–A' of FIG. 3A, and FIG. 3D is a detail view of part A of FIG. 3C. A package 1000 according to the first embodiment includes a plurality of leads 120 having a hemispheric groove 121, a chip 100 mounted on the leads 120 such that the back surface of the chip 100 faces an inner surface of the groove of the leads 120, rubins 115 for bonding the leads 120 to the chip 100, a plurality of bonding wires 110 for electrically connecting the leads 120 to the chip 100, and a molding material 105.

The leads 120 are arranged along a side of the chip 100 such that the inner surface of the groove of the leads 120 faces the chip 100. Also, the leads 120 are not in contact with each other and are arranged on a lower portion of the chip 100. The leads 120 can be arranged in a parallel structure or a rectangular structure. In the parallel structure, the leads 120 are arranged on two opposite sides of the chip 100, and in the rectangular structure, the leads 120 are arranged along the four sides of the chip 100. In the first embodiment, the leads 120 is arranged in the parallel structure. However, the arrangement structure can be adjusted according to the arrangement of bonding pads 101 of a top surface of the chip 100.

One end of the leads 120 is in contact with the bonding wires 110, and another end faces the center of the chip 100. The leads 120 are long, mostly flat plates having a certain thickness and width and a hemispheric groove 121 that is formed in a portion of the leads 120. The leads 120 have a thickness between 125 $\mu$m and 500 $\mu$m, and are made of an alloy of Cu. The thickness, material, and arrangement structure of the leads 120 according to the first embodiment can be equally applied to the alternate embodiments and other embodiments described below.

The groove 121 is a hemisphere with a diameter between 100 $\mu$m and 500 $\mu$m. The rubins 115 sit on the inner surface of the groove 121 to bond the leads 120 to the chip 100. Also, part 121a of an outer surface of the groove 121 is in contact with the board 2000 on a lower part of the package 1000 and functions an external connection terminal for electrically connecting the package 1000 to an external terminal. The shape of part 121a of an outer surface of the groove 121 is a hemisphere so that the package 1000 can be mounted on the board 2000. A solder paste 130 is used to bond part 121a of an outer surface of the groove 121 to the board 2000.

A plating film 125 is further included in an part 121a of an outer surface of the groove 121. The plating film 125 is formed of an alloy of Sn and Pb or plating materials excluding Pb. The thickness of the plating film 125 is between 10 $\mu$m and 50 $\mu$m.

When shock is applied to the package 1000 or there is a change in the ambient environment such as a change in temperature, stress accumulates in the package 1000. When stress accumulates in the package 1000, the molding material 105 can crack, or the chip 100 can cause a malfunction. When stress due to shock occurs in the package 1000, the stress is transmitted to the groove 121 of the leads 120. Since the shape of the groove 121 is a hemisphere, the stress is uniformly spread to the outer surface of the hemisphere, and thus little stress is transmitted to the solder paste 130, and solder joint reliability with the board 2000 can be increased.

The chip 100 is mounted on the leads 120 such that the bottom surface of the chip 100 faces the inner surface of the groove 121. The leads 120 are electrically connected to the bonding pads 101 on the top surface of the chip 100 by the bonding wires 110 which are gold wires.

The rubins 115 are inserted on the inner surface of the groove 121 of the leads 120, thereby bonding the chip 100 to the leads 120. The shape of the rubins 115 is a sphere having a diameter between 100 $\mu$m and 600 $\mu$m. The rubins 115 are soft and nonconductive and have good adhesive strength. The rubins 115 can be manufactured by a dotting or a screen printing process. Since a soft material is used for the rubins 115, stress due to different thermal transfer coefficients of the molding material 105, the chip 100, and the leads 120 and also stress due to shock applied to the package 1000 are alleviated. Thus, the rubins 115 prevent the chip 100 and the solder paste 130 from cracking.

The molding material 105 molds the chip 100, the leads 120, the rubins 115, and the bonding wires 110 so that part 121a of an outer surface of the groove of the leads 120 projects past the molding material 105. The amount H by which part 121a of an outer surface of the groove 121 projects past the molding material 105 is between 20 $\mu$m and 300 $\mu$m. The thickness of the molding material 105 is between 0.7 $\mu$m and 1.5 $\mu l$ m.

The package 1000 can be singularized by a sawing process after the package 1000 is molded by a block mold type. In a case where the package 1000 is singularized using the method, outer ends of the leads 120 of the package 1000 are surrounded above and below by the molding material 105, and a burr does not occur on the ends of the leads 120.

A process for manufacturing a package 1000 will be briefly described. First, a lead frame having hemispheric grooved leads 120 is prepared. The leads 120 can be arranged in a parallel structure or a rectangular structure. Next, a chip 100 is bonded to the lead frame using rubins 115 or a flat plate adhesive as described in a third embodiment. Subsequently, bonding pads 101 on the top surface of the chip 100 are wire-bonded to the leads 120. After wire-bonding, a molding process is performed by a block mold type or an individual mold type, and a plating film is coated on part 121$a$ of an outer surface of a groove 121. A tape for preventing resin flash may be bonded to the part 121$a$ of the groove 121 before the molding process. If the molding process is performed by the block mold type after the plating process, the package 1000 is singularized by a sawing process. If the molding process is performed by the individual mold type, the package 1000 is singularized by a trimming process. The method for performing the molding process according the first embodiment can be equally applied to alternate embodiments and other embodiments described below.

Figure 4:
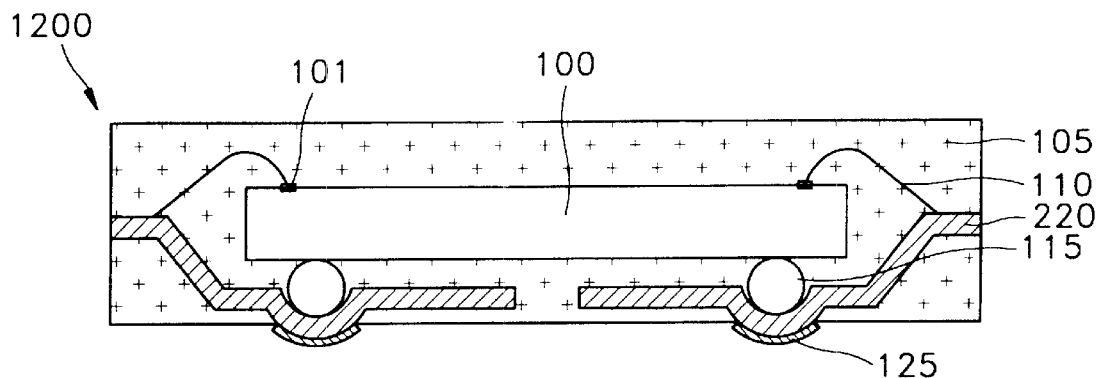
FIG. 4 is a sectional view of the power semiconductor package according to an alternate embodiment of the first embodiment of the present invention.

FIG. 4 is a sectional view of a power semiconductor package 1200 according to an alternate first embodiment of the first embodiment of the present invention. The package 1200 is formed of the same elements having the same shape, material, and dimension as in the above-mentioned first embodiment except for a difference in the shape of leads 220. That is, one end of the leads 220 is bent upwards to the upper portion of the chip 100, and consequently, the length of a wire loop of the bonding wires that connect the leads 220 to the bonding pads 101 on the lower surface of the chip 100 is shorter.

Figure 5:
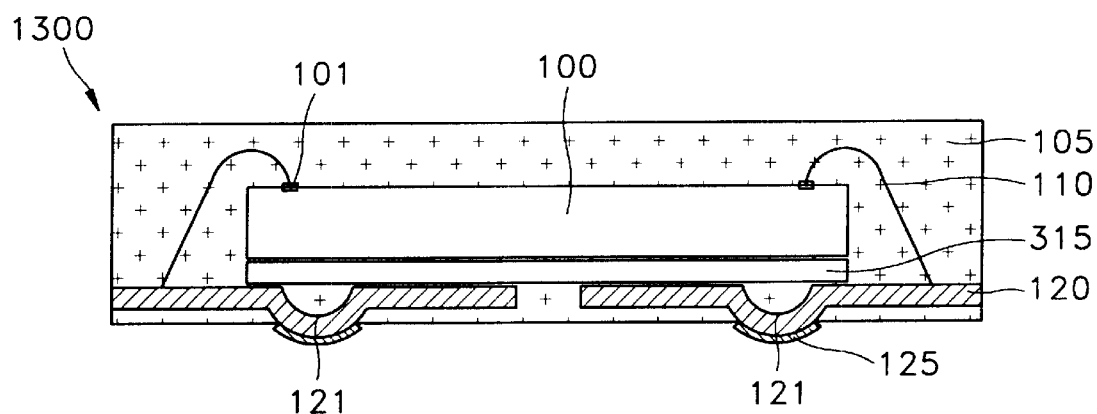
FIG. 5 is a section view of the power semiconductor package according to a second embodiment of the present invention.

FIG. 5 is a sectional view of a power semiconductor package 1300 according to a second embodiment of the present invention comprising a plurality of leads 120 having a hemispheric groove 121, a chip 100 mounted on the leads 120 such that the bottom surface of the chip 100 faces an inner surface of the groove 121, a flat plate adhesive 315 for bonding the leads 120 to the chip 100, a plurality of bonding wires 110 for electrically connecting the leads 120 to the chip 100, and a molding material 105.

The leads 120 are arranged along a side of the chip 100 such that the inner surface of the groove faces the chip 100. The entire bottom surface of the chip 100 is bonded to the leads 120 by the flat plate adhesive 315. Also, the leads 120, the chip 100, the bonding wires 110, and the flat plate adhesive 315 are molded by the molding material 105 and part of the groove 121 projects past the molding material 105. The leads 120, the chip 100, and the molding material 105 are the same elements having the same shape, material, and dimension as those in the above-mentioned first embodiment.

Since the flat plate adhesive 315 bonds the entire bottom surface of the chip 100 to the leads 120, the contact area between the chip 100 and the leads 120 is large. The flat plate adhesive 315 is bonded on the entire surface of the bottom surface of a wafer in the step of processing the wafer (not shown). Next, since the wafer is cut by a blade into an individual chip 100, separately forming an adhesive in a package process is not necessary. The flat plate 315 is formed of silica, AlN, or $Al_2O_3$. The thickness of the flat plate adhesive 315 is between 20 $\mu$m and 75 $\mu$m. The flat plate adhesive 315 is formed of a material having a high heat conductivity. By using a flat plate adhesive 315 having high heat conductivity, heat can be transferred to the leads 120 for dissipating heat generated in the wafer. Thus, the package 1300 has high thermal performance.

Figure 6:
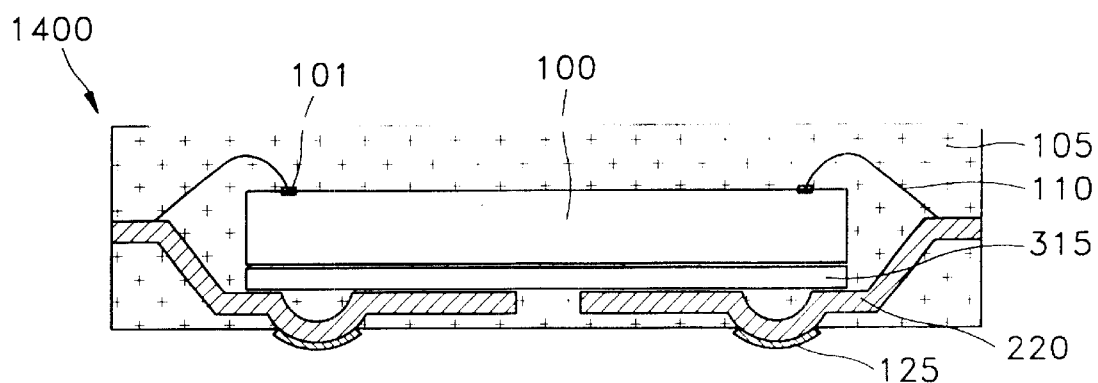
FIG. 6 is a sectional view of the power semiconductor package according to an alternate embodiment of the second embodiment of the present invention.

FIG. 6 is a sectional view of the power semiconductor package according to an alternate embodiment of the second embodiment of the present invention. The entire shape of the lead 220 is different in comparison with the above-mentioned second embodiment. That is, one end of the lead 220 is bent upwards to the upper portion of the chip 100, and consequently, the length of a wire loop of the bonding wires that connect the leads 220 to the bonding pads 101 on the top surface of the chip 100 is shorter. The elements, material, and dimension used in the alternate embodiment are the same as in the second embodiment.

The thickness of the molding material in the above-mentioned alternate embodiments and the second embodiment is between 0.7 $\mu$m and 1.5 $\mu$m.

Figure 7A:
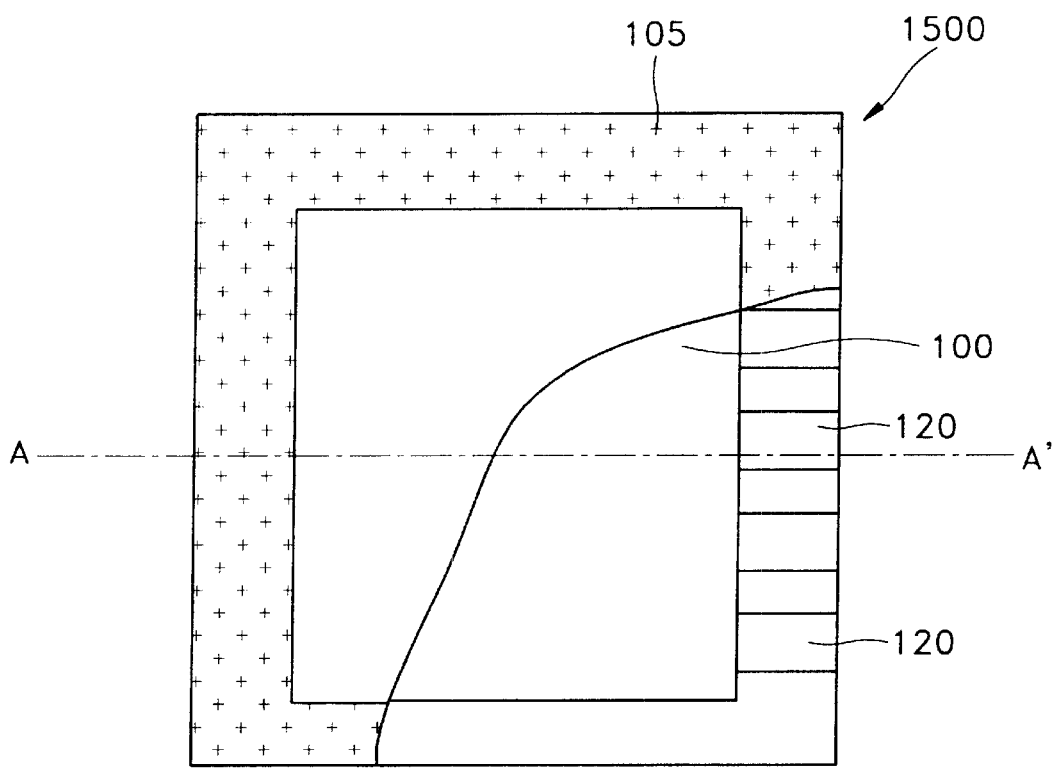
FIGS. 7A through 7B are diagrams of the power semiconductor package according to a third embodiment of the present invention.
Figure 7B:
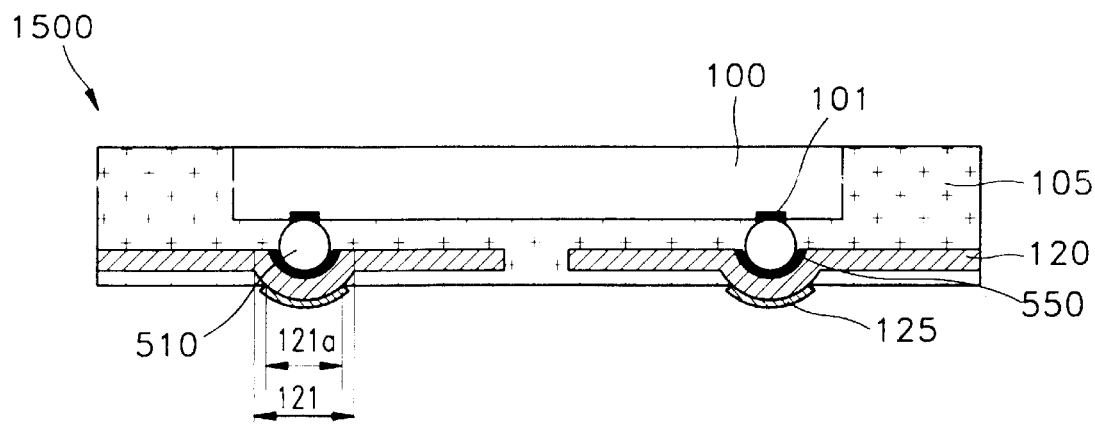

FIG. 7A is a top view of a power semiconductor package 1500 according to a third embodiment of the present invention, and FIG. 7B is a sectional view taken along line A–A' of FIG. 7A. The package 1500 according to the third embodiment includes a plurality of leads 120 having a hemispheric groove 121, a chip 100 mounted on the leads 120 such that a top surface of the chip 100 faces an inner surface of the groove 121 of the leads 120, a plurality of solder bumpers 510 on the inner surface of the groove of the leads 120 for electrically connecting the leads 120 to bonding pads 101 on the top surface of the chip 100, and a molding material 105. Hereinafter, differences in the structure and operation of the package 1500 will be described in comparison with the package 1000 in the above-mentioned first embodiment.

The leads 120 are arranged along a side of the chip 100 such that the inner surface of the groove of the leads 120 faces the bonding pads 101 on the top surface of the chip 100. The leads 120 can be arranged in a parallel structure or a rectangular structure. The solder bumpers 510 are seated on the inner surface of the groove 121. Part 121$a$ of an outer surface of the groove functions as an external connection terminal for electrically connecting the package 1500. The shape, material, and dimension of the leads and the groove are the same as in the first embodiment.

Preferably, a metal layer 550 is further included on the inner surface of the groove of the leads 120 of Ni or an alloy of Ni and Sn. The thickness of the metal layer 550 is between 4 $\mu$m and 15 $\mu$m. A plating film 125 is further included on the surface of part 121$a$ of an outer surface of the groove of the leads 120. The material and thickness of the plating film 125 is the same as in the first embodiment. Since the groove 121 of the leads 120 is in the shape of a hemisphere, solder joint reliability with the package 1500 and a board (not shown) can be increased.

The chip 100 is mounted on the leads 120 such that the top surface of the chip 100 having the bonding pads 101 faces the inner surface of the groove 121 of the leads 120.

The solder bumpers 510 are inserted on the inner surface of the groove 121 of the leads 120 and electrically connect the bonding pads 101 of the chip 100 to the leads 120. The electrically-connected length of the solder bumpers 510 is shorter than the bonding wires 110 of the first embodiment. Thus, the electrical performance of the package 1500 is increased. Also, the bonding wires 110 of the first embodiment require extra space to connect the chip 100 to the leads 120. However, since the solder bumpers 510 do not require extra space, the thickness and size of the package 1500 is reduced. Thus, the thickness of the molding material 105 is between 0.5 μm and 1.2 μm. The solder bumpers 510 is formed of an alloy of Pb and Sn, Sn, or Au. The diameter of the solder bumpers 510 is between 50 μm and 500 μm.

The molding material 105 molds the leads 120, the chip 100, and the solder bumpers 510 such that part 121a of an outer surface of the groove of the leads 120 is exposed. Since the bottom surface of the chip 100 is exposed, heat generated in the chip 100 during operation of the chip 100 can be easily dissipated. Thus, the thermal performance of the package 1500 is improved.

Figure 8A:
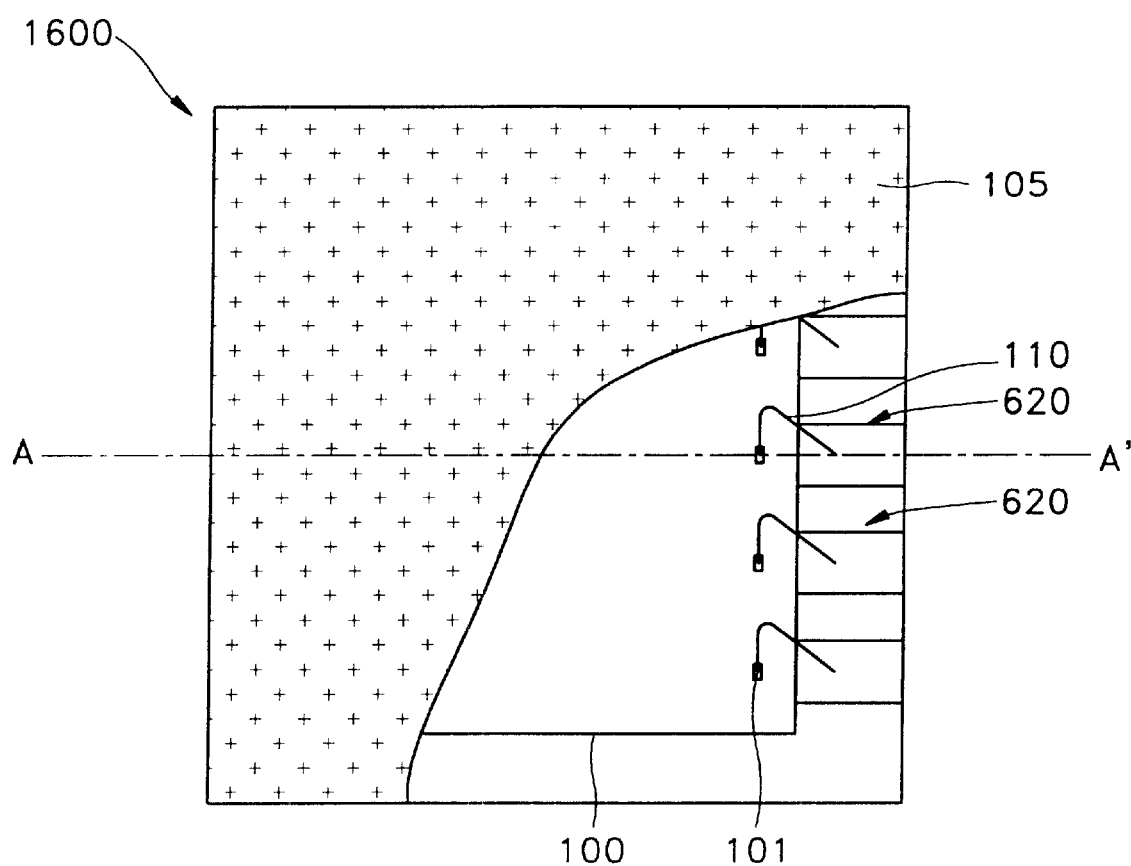
FIGS. 8A through 8C are diagrams of the power semiconductor package according to a fourth embodiment of the present invention.
Figure 8B:
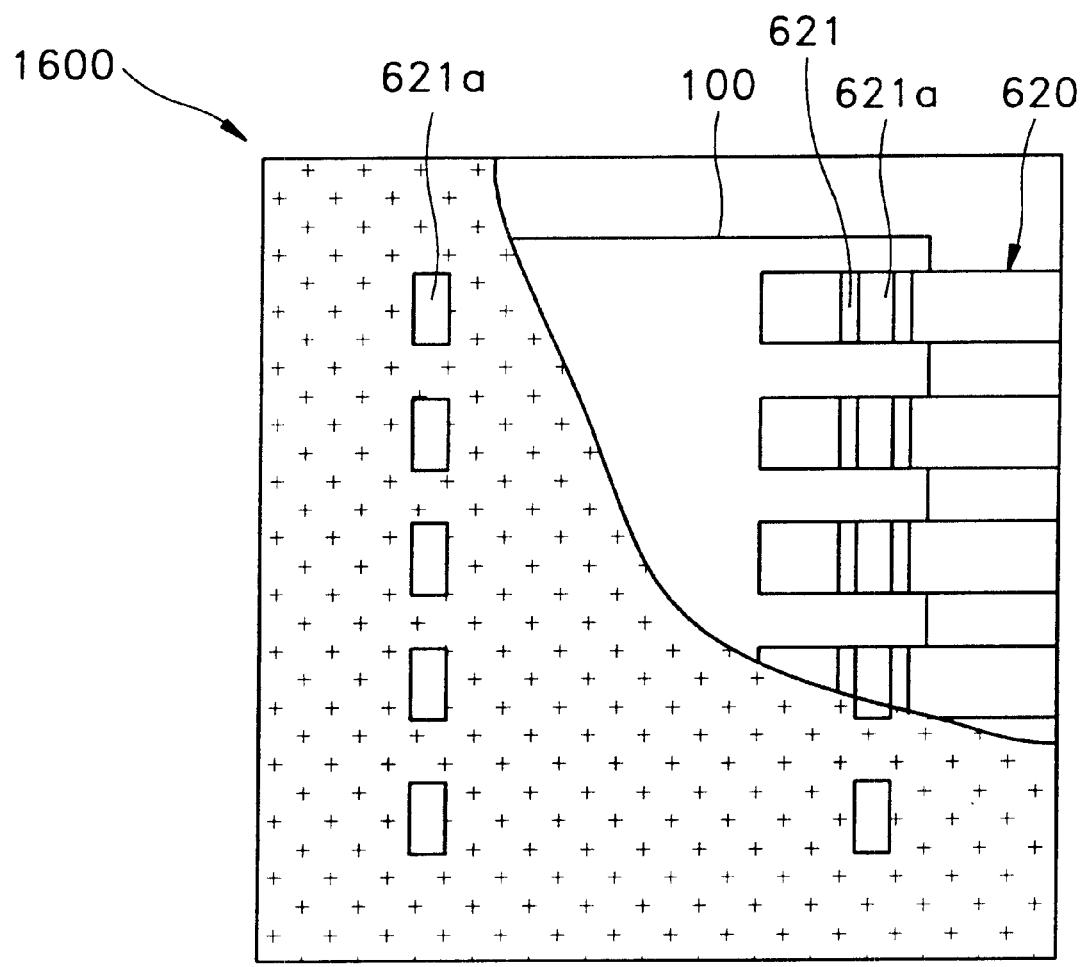
Figure 8C:
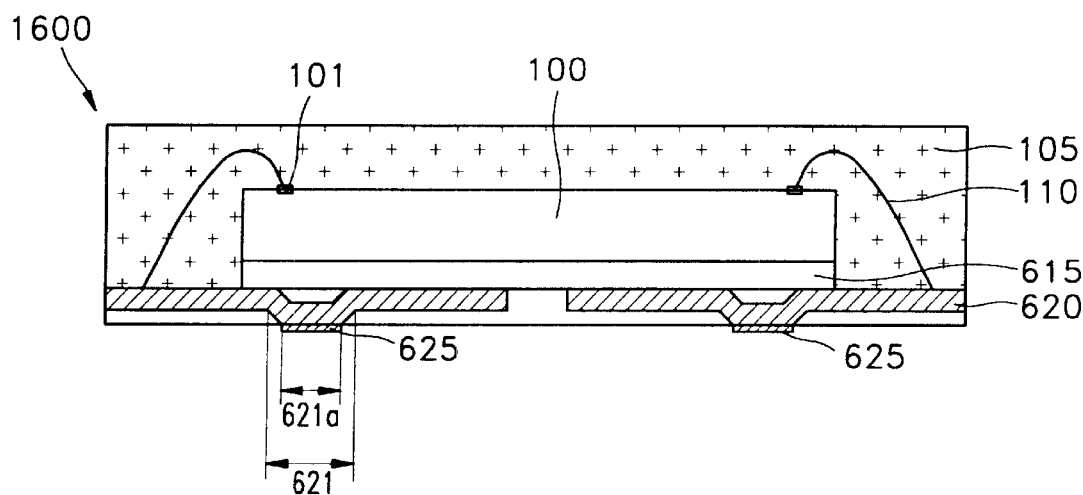

FIG. 8A is a top view of a power semiconductor package 1600 according to a fourth embodiment of the present invention, FIG. 8B is a bottom view of the power semiconductor package 1600, and FIG. 8C is a sectional view taken along line A–A' of FIG. 8A. The package 1600 according to the fourth embodiment is different in the shape of the groove 621 of leads 620 and an adhesive 615 used in comparison with the power semiconductor package 1000 in the above-mentioned first embodiment. Also, the effect of the change is different. Hereinafter, the differences will be described.

The package 1600 includes a plurality of leads 620 having a down-set shaped groove 621, a chip 100 mounted on the leads 620 such that the bottom surface of the chip 100 faces an inner surface of the groove of the leads 620, a flat plate adhesive 615 for bonding the leads 620 to the chip 100, a plurality of bonding wires 110 for electrically connecting the leads 620 to the chip 100, and a molding material 105.

The leads 620 are arranged along a side of the chip 100 such that the inner surface of the groove of the leads 620 faces the chip 100. The dimension, material, and arrangement structure of the leads 620 are the same as in the first embodiment.

The down-set shaped groove 621 is formed on a portion of the leads 620. Part 621a of an outer surface of the groove 621 is in contact with a board (not shown) when the package 1600 is mounted on the board. Since the down-set shaped groove 621 can be easily manufactured during a lead frame manufacturing process, the manufacturing cost is less than that of the lead frame in the first embodiment. The depth of the inner surface of the groove is between 50 μm and 375 μm. Preferably, a plating film 625 is further included on the surface of part 621a of an outer surface of the groove. The plating film 625 is formed of an alloy of Sn and Pb, Sn, Ni, or a multilayer of Ni and Pd. Also, the thickness of the plating film 625 is between 5 μm and 25 μm.

One end of the leads 620 is electrically connected to the bonding pads 101 on the top surface of the chip 100 by the bonding wires 110 which are preferably formed of gold wires.

The flat plate adhesive 615 bonds the entire bottom surface of the chip 100 to the leads 620 which have the same thickness and material as the flat plate adhesive 315 in the second embodiment. By using the flat plate adhesive 615, the thermal performance of the package 1600 can be improved, and the size of the package 1600 can be reduced.

The molding material 105 molds the leads 620, the flat plate adhesive 615, and the bonding wires 110 so that part 621a of an outer surface of the groove 621 of the leads 620 is exposed. The molding material 105 can be formed to a thickness between 0.5 mm and 1.5 mm.

Figure 9A:
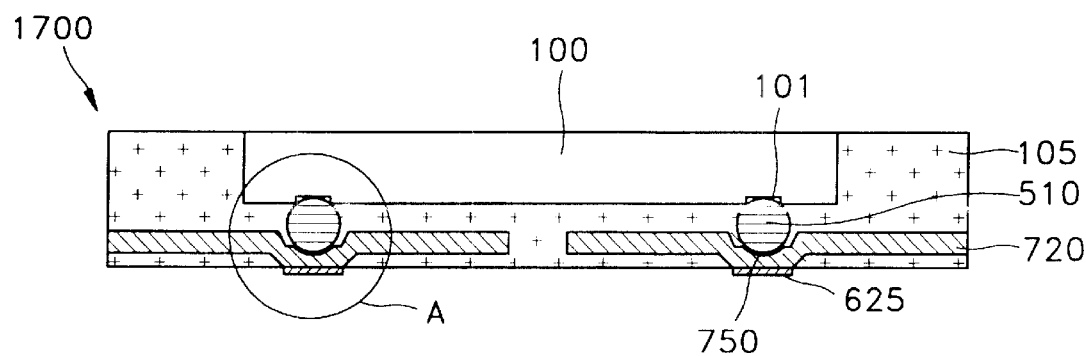
FIGS. 9A through 9C are diagrams of the power semiconductor package according to a fifth embodiment of the present invention.
Figure 9B:
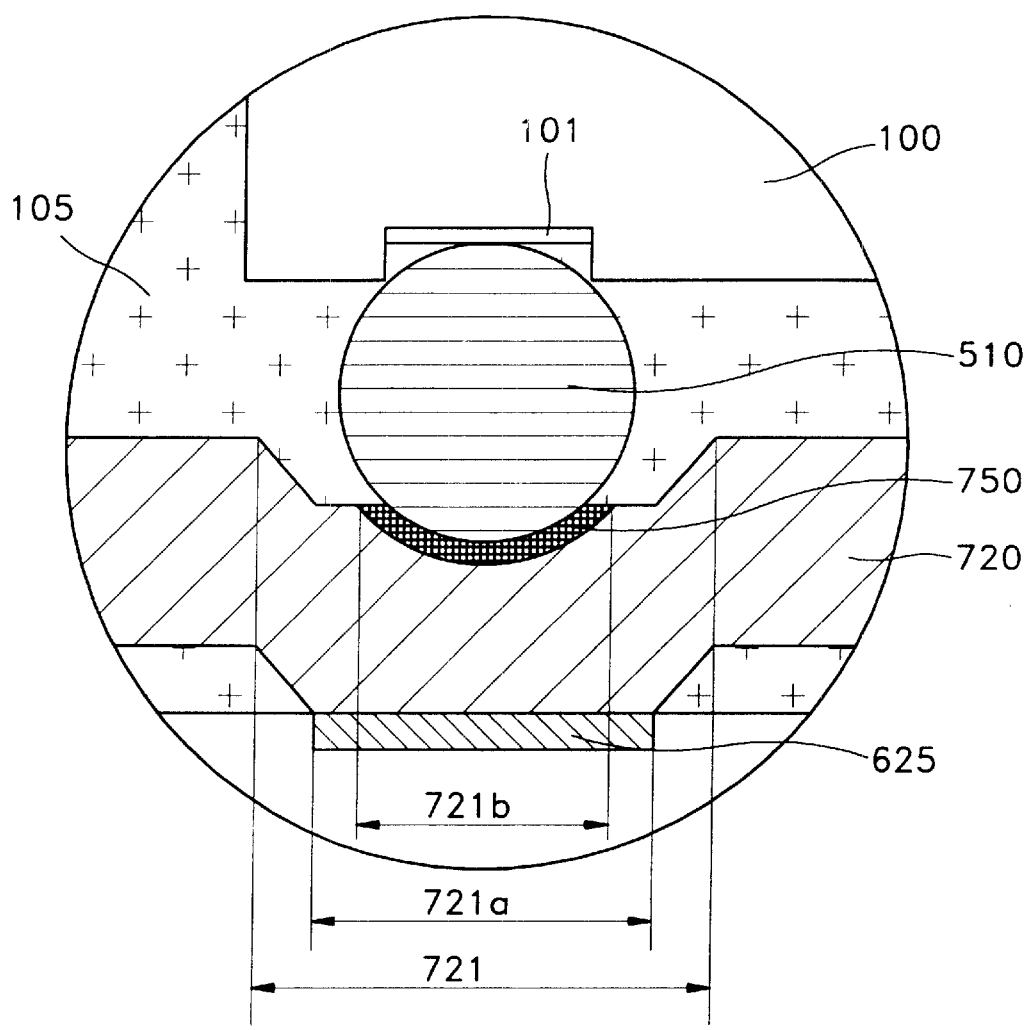
Figure 9C:
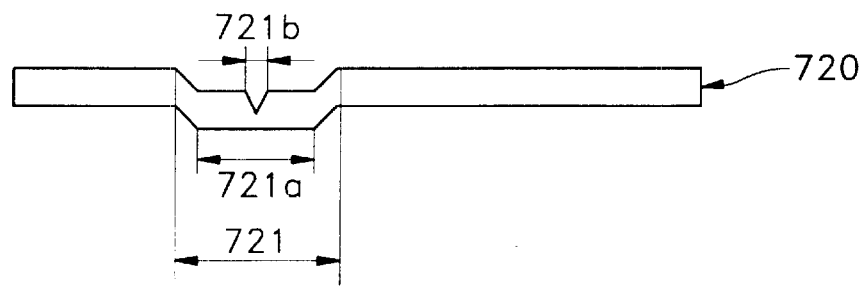

FIG. 9A is a sectional view of a power semiconductor package 1700 according to a fifth embodiment of the present invention, FIG. 9B is a detail view of part A of FIG. 9A, and FIG. 9C is an alternate embodiment of a seating groove. The package 1700 according to the fifth embodiment includes a plurality of leads 720 having a down-set shaped groove 721, a chip 100 mounted on the leads 720 such that a top surface of the chip 100 having bonding pads 101 faces an inner surface of the groove of the leads 720, a plurality of solder bumpers 510 inserted on the inner surface of the groove of the leads 720 for electrically connecting the leads 720 to the bonding pads 101 on the top surface of the chip 100, and a molding material 105. Hereinafter, differences in the structure and operation of the package 1700 will be described in comparison with the package 1600 in the above-mentioned fourth embodiment.

The groove 721 formed on a portion of the leads 720 has a down-set shape, and a seating groove 721b is formed on the inner surface of the groove 721. The thickness, material, and arrangement of the leads 720 are the same as in the first embodiment. The thickness of the inner surface of the groove 721 is between 50 μm and 375 μm.

The solder bumpers 510 are easily seated on the seating groove 721b. The shape of the seating groove 721b can be changed according to its manufacturing method. That is, in a case where the leads 720 are manufactured by etching, the sectional shape of the seating groove 721b is an arc. In a case where the leads 720 are manufactured by stamping, it is difficult for the section of the seating groove 721b to be an arc. FIG. 9C is a sectional view when the leads 720 are manufactured by stamping, and the shape of the seating groove 721b can be manufactured in forms such as a cone and a star in view of a plane. The depth of the seating groove 721b is between 60 μm and 300 μm.

A metal layer 750 is further formed on the surface of the seating groove 721b, and a plating film 625 is further formed on the surface of part 721a of an outer surface of the groove. The material and thickness of the metal layer 750 are formed as specified in the third embodiment, and the material and thickness of the plating film 625 are formed as specified in the fourth embodiment.

The top surface of the chip 100 having the bonding pads 101 faces the inner surface of the groove of the leads 720, and the part 721a of an outer surface of the groove 721 is exposed outside the package 1700. Thus, heat generated in the chip 100 can be easily dissipated and the thermal performance of the package 1700 can be improved.

The solder bumpers 510 shorten the connection distance between the chip 100 and the leads 720. Thus, electrical performance of the package 1700 can be improved, and size of the package 1700 is reduced. The diameter and material of the solder bumpers 510 are formed as specified in the third embodiment.

The molding material 105 molds the leads 720, the chip 100, and the solder bumpers 510 so that the part 721a of an outer surface of the groove of the leads 720 and the bottom surface of the chip 100 are exposed outside the package 1700. The molding material 105 can be formed to a thickness between 0.5 mm and 1.5 mm.

As described above, solder joint reliability can be increased by a groove in leads and by rubins. Also, the bottom surface of a chip is in contact with the leads which projects part of a package, thereby improving the thermal performance of the package. Since a die pad on which the chip is mounted is not necessary, the size of the package can be reduced. A sawing process can be performed so that a burr does not occur when the package is singularized after a molding process is performed by a block mold type.

What is claimed is:

1. A power semiconductor package comprising:
   a plurality of leads each having a groove that has an inner surface facing a chip and arranged along a side of the chip;

a chip mounted on the leads;

a plurality of conductive media for electrically connecting the leads to bonding pads on a top surface of the chip; and a molding material for molding the leads, the chip, and the conductive media so that part of an outer surface of the groove of each of the leads is exposed.

2. The power semiconductor package according to claim 1 further comprising an adhesive for bonding the chip to the leads.

3. The power semiconductor package according to claim 2, wherein the adhesive is rubins inserted on an inner surface of the groove.

4. The power semiconductor package according to claim 2, wherein the adhesive is a flat plate adhesive for bonding the entire bottom surface of the chip.

5. The power semiconductor package according to claim 4, wherein the flat plate adhesive is formed of one material selected from material groups formed of silica, aluminum nitride (AlN), and alumina ($Al_2O_3$).

6. The power semiconductor package according to claim 1, wherein the conductive media are bonding wires or solder bumpers.

7. The power semiconductor package according to claim 1, wherein the leads are arranged in a parallel structure or a rectangular structure.

8. The power semiconductor package according to claim 1, wherein the shape of the groove is a hemisphere.

9. The power semiconductor package according to claim 8, wherein a height of an exposed portion of an outer surface of the groove is between 20 µm and 300 µm.

10. The power semiconductor package according to claim 8, wherein a plating film is further included on the part of an outer surface of the groove.

11. The power semiconductor package according to claim 10, wherein the plating film is formed of one material selected from an alloy of Sn and Pb and plating materials excluding Pb.

12. The power semiconductor package according to claim 8, wherein the diameter of the hemispheric groove is between 100 µm and 500 µm.

13. The power semiconductor package according to claim 8, wherein a metal layer is further included on the inner surface of the groove.

14. The power semiconductor package according to claim 13, wherein the metal layer is formed of one material selected from Ni and an alloy of Ni and Sn.

15. The power semiconductor package according to claim 13, wherein the thickness of the metal layer is between 4 µm and 15 µm.

16. The power semiconductor package according to claim 1, wherein the shape of the groove is a down-set.

17. The power semiconductor package according to claim 16, wherein a seating groove for seating the conductive media is further comprised on the inner surface of the groove.

18. The power semiconductor package according to claim 17, wherein a metal layer is further included on the seating groove.

19. The power semiconductor package according to claim 18, wherein the metal layer is formed of one material selected from Ni and an alloy of Ni and Sn.

20. The power semiconductor package according to claim 18, wherein the thickness of the metal layer is between 4 µm and 15 µm.

21. The power semiconductor package according to claim 17, wherein the sectional shape of the seating groove is an arc.

22. The power semiconductor package according to claim 17, wherein the depth of the seating groove is between 60 µm and 300 µm.

23. The power semiconductor package according to claim 16, wherein the depth of the inner surface of the groove is between 50 µm and 375 µm.

24. The power semiconductor package according to claim 16, wherein a plating film is further included on the part of an outer surface of the groove.

25. The power semiconductor package according to claim 24, wherein the plating film is formed of one material selected from material groups formed of an alloy of Sn and Pb, Sn, Ni, and a multilayer of Ni and Pd.

26. A power semiconductor package comprising:

a plurality of leads each having a hemispheric groove that has an inner surface facing a chip and is arranged along a side of the chip;

a chip mounted on the leads such that a bottom surface of the chip faces an inner surface of the groove of each of the leads;

an adhesive for bonding the leads to the chip;

a plurality of bonding wires for electrically connecting the leads to bonding pads on the top surface of the chip; and a molding material for molding the leads, the chip, the adhesive, and the bonding wires so that part of an outer surface of the groove of each of the leads projects past the molding material.

27. The power semiconductor package according to claim 26, wherein the thickness of the molding material is between 0.7 µm and 1.5 µm.

28. A power semiconductor package comprising:

a plurality of leads each having a hemispheric groove that has an inner surface facing a chip and is arranged along a side of the chip;

a chip mounted on the leads such that a top surface of the chip has bonding pads, each of said bonding pads facing an inner surface of a corresponding one of the groove of the leads;

a solder bumper inserted on the inner surface of the groove of each of the leads for electrically connecting the leads to the bonding pads on the top surface of the chip; and a molding material for molding the leads, the chip, and the solder bumpers so that part of an outer surface of the groove of each of the leads projects past the molding material and the bottom surface of the chip is exposed.

29. The power semiconductor package according to claim 28, wherein the thickness of the molding material is between 0.5 µm and 1.2 µm.

30. A power semiconductor package comprising:

a plurality of leads each having a down-set shaped groove that has an inner surface facing a chip and is arranged along a side of the chip;

a chip mounted on the leads such that a bottom surface of the chip faces an inner surface of the groove of each of the leads;

a flat plate adhesive for bonding the leads to the chip;

a plurality of bonding wires for electrically connecting the leads to bonding pads on the top surface of the chip; and a molding material for molding the leads, the chip, the flat plate adhesive, and the bonding wires so that part of an outer surface of the groove of each of the leads is exposed.

31. The power semiconductor package according to claim 30, wherein the thickness of the molding material is between 0.5 mm and 1.5 mm.

32. A power semiconductor package comprising:
a plurality of leads each having a down-set shaped groove that has an inner surface facing a chip and is arranged along a side of the chip;
a chip mounted on the leads such that a top surface of the chip has bonding pads, each of said bonding pads facing an inner surface of a corresponding one of the groove of the leads;
a solder bumper inserted an the inner surface of the groove of each of the leads for electrically connecting the leads to the bonding pads on the top surface of the chip; and
a molding material for molding the leads, the chip, and the solder bumpers so that part of an outer surface of the groove of each of the leads and the bottom surface of the chip are exposed.

33. The power semiconductor package according to claim 32, wherein the thickness of the molding material is between 0.5 mm and 1.5 mm.

34. The power semiconductor package according to claim 32, wherein a seating groove for seating the solder bumper is further comprised on the inner surface of the groove.

* * * * *